United States Patent [19]

Kelley et al.

[11] 4,101,925
[45] Jul. 18, 1978

[54] CENTRIFUGAL FORMING THIN FILMS AND SEMICONDUCTORS AND SEMICONDUCTOR DEVICES

[76] Inventors: Larry P. Kelley, 1024 State St.; Craig A. Hardy, Circle Dr., both of Hart, Mich. 49420

[21] Appl. No.: 787,750

[22] Filed: Apr. 15, 1977

Related U.S. Application Data

[63] Continuation-in-part of Ser. No. 594,107, Jul. 8, 1975, abandoned.

[51] Int. Cl.² ............................................. H01L 23/48
[52] U.S. Cl. ..................................... 357/68; 29/572; 118/52; 136/89 CC; 156/622; 427/86
[58] Field of Search ................... 29/572, 576 R, 589; 156/622; 136/89; 118/52, 53, 55, 56; 427/86, 240; 357/68

[56] References Cited

U.S. PATENT DOCUMENTS

| 1,630,045 | 5/1927 | Yeomans | 116/118 |
|---|---|---|---|
| 1,831,310 | 11/1931 | Lindemuth | 23/273 C |
| 2,178,163 | 10/1939 | Davidson | 164/118 |
| 3,672,429 | 6/1972 | Lajoye | 164/118 |
| 3,857,436 | 12/1974 | Petrov | 164/60 |
| 3,984,256 | 10/1976 | Fletcher | 29/572 |
| 4,052,782 | 10/1977 | Weinstein | 29/572 |

FOREIGN PATENT DOCUMENTS

| 2,314,109 | 10/1973 | Fed. Rep. of Germany | 156/622 |
|---|---|---|---|
| 1,423,594 | 2/1976 | United Kingdom | 156/622 |

Primary Examiner—W. Tufman
Attorney, Agent, or Firm—McGarry & Waters

[57] ABSTRACT

A method and apparatus for centrifugally forming thin semiconductor films or layers wherein centrifugal force is applied to a molten single-crystal forming material to overcome surface tension and evenly spread the material along a substrate surface substantially parallel to the axis of rotation. The material is thereafter cooled, uniformly or progressively from a seed single crystal, to form a thin layer or film of crystalline material. Desirably, the films or layers will be substantially single crystals. The process and apparatus are useful in forming thin, semiconductor crystal layers useful, for example, in solar cells. Semiconductor devices according to the invention have a porous graphite substrate, a thin film or layer of silicon and a gridwork plated onto the silicon. The interface between the silicon grid graphite substrate is substantially free from silicon carbide.

16 Claims, 2 Drawing Figures

CENTRIFUGAL FORMING THIN FILMS AND SEMICONDUCTORS AND SEMICONDUCTOR DEVICES

CROSS-REFERENCE TO RELATED APPLICATIONS

This application is a continuation-in-part of copending U.S. patent application Ser. No. 594,107, filed July 8, 1975, now abandoned.

BACKGROUND OF THE INVENTION

1. Field of the Invention

This invention relates to forming thin crystalline layers of films. In one of its aspects, the invention relates to a method for forming a crystalline film of, for example, a semiconductor material. In another of its aspects, the invention relates to a method for forming a semiconductor device. In still another of its aspects, the invention relates to an apparatus for forming crystalline layers, predominantly single crystalline in nature. In still another of its aspects, the invention relates to semiconductor devices.

2. State of the Prior Art

Semiconductor devices having semiconductor layers bonded to a conductive substrate are used for many electrical purposes including the generation of electricity from light. Such devices are commonly known as solar cells of photovoltaic cells. Such devices are currently manufactured by first providing a single-crystal rod by, for example, the so-called Czochralski method wherein the rod is pulled from a mass of molten raw material. The rod is thereafter ground to achieve a given outer diameter and the rod is cut in thin slices transversely to the axis of the rod to provide thin semiconductor layers, thus resulting in significant waste of material due to the thickness of the saw blade.

The layers thus cut are lapped to produce a smooth surface which is then doped with an impurity to form a junction. A grid is thereafter plated onto the smooth surface and a conductive substrate is plated or bonded onto the obverse side thereof. Conductive leads are then secured to both sides of the device.

The above system is time consuming, intensive of highly skilled labor and highly inefficient in terms of the use of the single crystalline material. Thus, devices produced by the crystal-pulling method tend to be quite expensive. As a result, the solar cell devices produced by this method are presently not competitive with conventional forms of electricity generation.

Thin films of semiconductor materials can be grown by vapor deposition onto substrates. However, it is believed that the substrates must be single crystals with a lattice structure similar to the film layer in order for the deposited film to be a single crystal, thereby limiting the applications of such methods.

Single crystals have also been formed in a boat or container which is progressively passed through a heat zone to render molten the contained material. Progressive cooling thereafter solidifies the material into one or more single crystals. This method however cannot practically be used for thin layers of, for example, silicon, because of the high surface tension of such material at the melting point thereof. Furthermore, deposition of silicon on carbon substrates has been accompanied by the formation of silicon carbide which is undesirable in solar cell devices because of the insulating properties of the same.

SUMMARY OF THE INVENTION

According to the invention, thin single-crystal containing layers or films are formed by applying a centrifugal force to a liquid crystal-forming material to flow the liquid crystal-forming material along a substrate surface to form a substantially uniform thin layer of such material, and cooling the liquid material to form a thin film or layer having at least single-crystal portions. The centrifugal force counteracts the surface tension of the molten film forming material and spreads the material much thinner than would be possible under ordinary gravimetric conditions. The liquid crystal forming material can contact a seed single crystal and be progressively cooled, in which case the crystalline film will generally assume the orientation of the seed crystal. Alternately, crystal formation can take place in the absence of a seed crystal by directional solidification whereupon the resulting thin film will have multiple but relatively large crystals. In the case of higher melting point materials, the material can be heated during the application of the centrifugal force.

The crystal forming materials can be nearly any material which forms a single crystal by the Czochralski method, i.e. those materials which can be grown in single crystalline form onto a seed crystal at the melting point of the material. These materials are necessarily relatively pure, i.e. without significant impurities or alloying materials. The process is especially useful in forming thin single-crystal layers of semiconductor material, such as silicon. Conductors and nonconductors can also be formed into thin layers with the method and apparatus of the invention. Examples of such nonconductors are sapphire ($Al_2O_3$) and yttrium aluminum garnet.

In carrying out the process of the invention, the substrate is rotated about an axis which is parallel to the surface thereof. The crystal forming material is forced evenly along the substrate surface against the surface tension of the material into contact with the seed single crystal, if the same is used. Desirably, the cooling step takes place progressively from the seed crystal or from some terminal area of the film in the event a seed crystal is not used.

With the use of the method, films thinner than that achievable under ordinary gravimetric conditions, i.e. without centrifugal forces, films of silicon and other materials as thin as 0.001 in. (0.025 mm) can be successfully made.

Preferably, the substrate is an elongated planar surface formed of a cylindrical section with a radius of curvature substantially equal to the distance from the axis of rotation to the curved surface. The axis of the cylindrical section is parallel to the axis of rotation of the substrate. Thus, the molten material will be spread evenly to all portions of the substrate.

The substrates can be formed of any material, whether conducting, semiconducting or nonconducting, which has a melting point higher than that of the crystal forming material and which is not reactive with or harmful to the crystal forming materials. However, the invention finds particular utility in the use of a conductor, preferably porous carbon, as the substrate on which the film adheres. Thus, on formation of crystalline semiconductor films on the substrate surface, the basic semiconductor device will be formed upon solidification of the film. Significantly, the use of centrifugal force in forming of the films allows the temperature to be controlled at or near the melting point of the material to avoid reaction of the material with the substrate. It has been found, for example, that thin silicon films can be formed directly on porous carbon substrates without formation of silicon carbide. Since silicon carbide is an insulator, the formation of silicon carbide at the junction of the substrate and the silicon layer is undesirable.

In another embodiment, the film is formed on a nonadhering substrate from which the film is peeled. In still another embodiment of the invention the substrate is a nonconductor, such as sapphire and quartz.

The process of the invention is conveniently used in the manufacture of semiconductor devices according to the invention wherein a thin layer of carbon or other nonharmful conductive material is used as the substrate. After the layer forming method is performed, an impurity is doped into the single-crystal semiconductor layer forming a junction while the layer is still warm, thereby eliminating a separate reheating process. The crystalline surface formed by the method of the invention is sufficiently smooth so as to generally avoid the conventional lapping operations which are performed on the sliced semiconductor layers of the prior art methods. The semiconductor devices according to the invention have an interface between the porous carbon substrate and the semiconductor material which interface is substantially free from carbide, as for example silicon carbide.

The substrate and the semiconductor film can be plated in conventional fashion, cut, if necessary, to desirable size, and have leads soldered thereto to complete the semiconductor device.

In the preferred embodiment of the invention, a silicon film is formed onto a porous carbon substrate. The silicon material is solar grade purity silicon which is substantially free from impurities. The carbon substrate is a porous compressed carbon having a porosity in the range of 5% to 23%, preferably about 12%.

The substrate thickness can vary over a wide range but must have sufficient structural integrity to support the molten layer under centrifugal force. Generally, the thickness of the substrate will be at least 0.5 mm. and preferably in the range of 1 mm. to 4 mm. in thickness.

Thus, with the use of the method, thin semiconductor layers or films can be formed directly on a conductive substrate, thereby eliminating the separate steps of cutting the layers and attaching a substrate thereto. Further, lapping is avoided and wasting of materials is minimized. Further, since the single-crystal layer is a fraction of the thickness of the cut layers, the material costs in the semiconductor device thus produced by the method of the invention are significantly lower. The centrifugal force enhances the adherence of the semiconductor to the substrate, especially when a porous carbon is used as the substrate. The molten material is believed to be forced into the pores of the substrate by the centrifugal force, thus providing a secure mechanical and electrical bond.

The speed at which the substrate is rotated is significant in achieving the thin uniform layers. The speed will depend however on the nature of the material, the surface tension thereof at the temperature of the molten material and the radical distance from the axis of rotation to the substrate. For example, for silicon, the speed will vary from 1300 rpm to 2400 rpm to form films in the range of 0.5 mm. to 0.12 mm. when the layers are spread with the temperature of the material in the range of 2,579° to 2,642° F (1411° to 1450° C) and the radial distance from the axis of rotation to the substrate is 30.9 mm. Preferably, the temperature of the silicon is maintained in the range of 5° to 40° C above the melting point of silicon during the spreading step to minimize formation of silicon carbide at the interface between the silicon and carbon.

Further according to the invention, there is provided an apparatus for forming films predominantly of single crystals. The apparatus of the invention includes a substrate having a planar surface and boundary walls at the edge of the substrate and a holder for supporting the substrate for rotation about an axis parallel to the planar surface of the substrate. Induction coils or other suitable liquifying means liquify a crystal-forming material on the planar surface. If desired, means position a seed single crystal adjacent to the planar surface. Means rotate the holder about an axis substantially parallel to the substrate planar surface at a speed sufficient to force the crystal forming material, when liquid, uniformly along the substrate to form a thin layer and into contact with the seed single crystal, if one is used. Thereafter, cooling of the molten layer, preferably progressively from the seed single crystal or from a given point in the event a seed crystal is not used, forms a layer having at least single-crystal portions. In order to accomplish the heating and cooling functions of the apparatus, means are provided to move the liquifying means relative to the holder. The substrate boundary walls contain the liquid crystal forming material prior to solidification. The substrate is preferably elongated in nature and the seed single crystal positioning means is provided at one longitudinal end of the planar surface. Desirably, the planar surface is a cylindrical section which has a radius of curvature substantially equal to the radial distance between the axis of rotation of the holder and the planar surface.

BRIEF DESCRIPTION OF THE DRAWINGS

The invention will now be described with reference to the accompanying drawings in which.

DETAILED DESCRIPTION OF THE DRAWINGS

Figure 1:
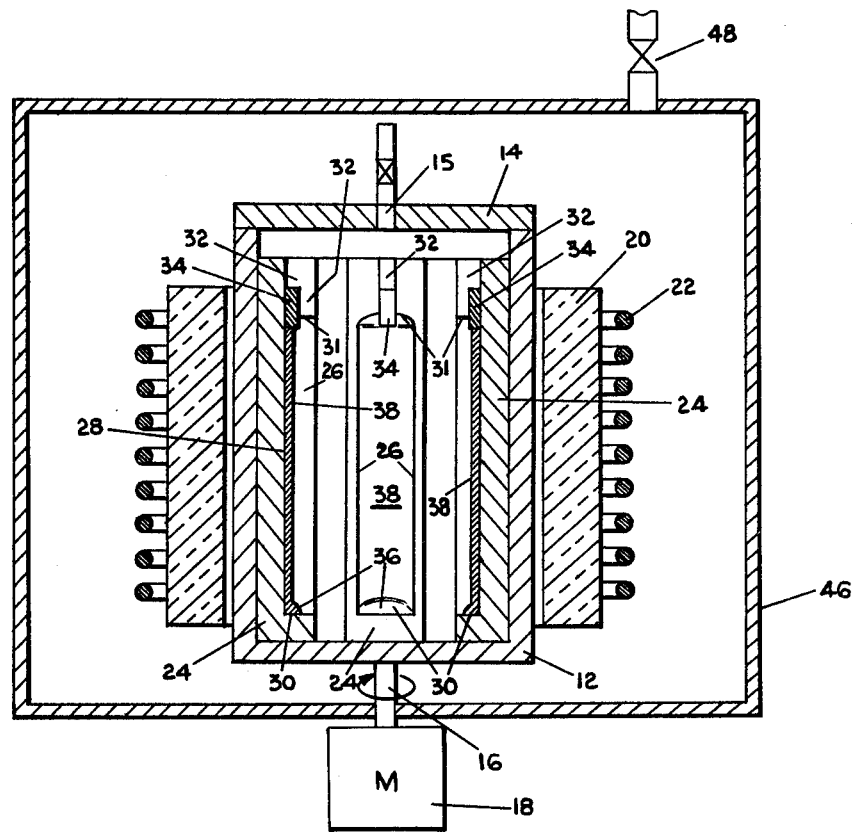
FIG. 1 is a sectional view of a centrifuge illustrating the method and apparatus in which single-crystal films are formed according to the invention.

Referring now to the drawings, and to FIG. 1 in particular, there is shown a centrifuge comprising a cylindrical container 12 having a removable top 14 which may be secured to the container in normal operation. A valved opening 15 is provided in the top 14 to supply an atmosphere or to draw a vacuum on the container. The container 12 is supported by an output shaft 16 of rotating means 18 so that the container 12 rotates about the axis of the shaft 16. The top 14 holds the atmosphere in the container so that the atmosphere therein spins with the contents and does not disturb the flowing of the liquid materials therein.

Cylindrical insulation 20 surrounds the container 12 and induction coils 22 surround the insulation 20. Electrical energy from a source (not shown) applied to the coils 22 in a conventional manner heats by induction materials within the container 12.

A sealed enclosure 46 surrounds the container 12, insulation 20 and induction coils 22. A valved conduit in the sealed enclosure 46 permits neutral atmosphere or a vacuum to be supplied to the enclosure and to the container 12.

A plurality of elongated substrate forming graphite boats 24 are vertically positioned within the container 12. Each of the graphite boats has an elongated cavity in one face thereof formed by sidewalls 26, a substrate wall 28 and end walls 30 and 31. At the upper portion of the recess, a slot 32 is formed in end wall 31.

A seed crystal 34 is secured within the slot 32. The seed crystal 34 is a single crystal of, for example, a semiconductor material such as silicon or germanium. A crystal forming starting material of the same composition (or a different composition with similar lattice parameters) as the seed crystal 34 is positioned in the container 12 against the substrate wall 28. The substrate wall 28 of the boat 24 forms the support and the substrate for the crystal forming material. The wall 28 has a radius of curvature substantially equal to the radial distance between the axis of rotation of the container 12 and the wall 28. This curvature assures even distribution of crystal forming material along horizontal sections of the wall due to uniform force applied to crystal forming material at such sections. Often, the obverse side of the substrate is also curved so that the boat, when removed from the container 12, can be shaped into a flat sheet.

In operation, the graphite boats are loaded with the seed crystal 34 securely positioned in the slot 32. The crystal forming material 36 is positioned in measured amounts against the substrate wall 28 of the boat 24. The boats are positioned within the container as illustrated in FIG. 1 in a balanced fashion. Top 14 is placed on the container and an inert atmosphere (or vacuum) is preferably introduced into the container 12 through the valved opening 15. A like inert atmosphere (or vacuum) is introduced into the sealed enclosure 46 through valved conduit 48. Thereafter, electrical energy is applied to the induction coils 22 so that the crystal forming material 36 is melted. Care is taken by proper positioning of the cylindrical insulation 20 and/or the induction coils 22 so that the seed crystal 34 is not melted. However, the entire length of the cavity in the boat 24 up to the seed crystal must be heated to a temperature at least as high as the melting point of the crystal forming material. To this end, the cylindrical insulation 20 and/or the induction coils 22 are mounted for vertical adjustment and can be operated by suitable controls (not shown). The temperature should be controlled, however, to maintain the molten crystal forming material at or near the melting point of the material. The lower temperatures and the speed at which the film is formed minimize reaction of the liquid crystal forming material with the substrate.

The container is spun at a sufficient rate of speed so that the centrifugal force applied to the crystal forming material, when liquid, causes it to be forced along the wall 28 of the boat 24 to form a thin, uniform layer 38. The thinness of the layer will be determined by the amount of material in the boat 24, the speed of rotation of the container 12 and the temperature of the liquid material. Of these factors, the speed of rotation is most important to overcome the surface tension of the liquid material. The liquid layer is allowed to flow until it reaches the seed crystal 34 and until a sufficiently uniform layer of the liuid material is present on the substrate wall 28. The insulation and/or the induction coils are then moved downwardly with respect to the container 12 so that selective cooling of the liquid layer 38 takes place starting at the seed crystal 34. As solidification of the thin layer 38 takes place, it will generally assume the orientation of the seed crystal 34 so that the resulting solid layer 38 will be predominantly single crystalline, that is, the layer 38 will consist of large areas, for example 4 square mm. to 16 square mm. of single crystal the entire thickness of the layer. The movement of the insulation and/or induction coils 22 continues until the entire layer 34 is solidified. As an alternate method of cooling, the heat applied by coil 22 can be reduced by reducing the power supplied thereto. The heat flow is such that the liquid layer will solidify from the top downwardly. In this alternate method, the resulting layer 38 will also be predominantly single crystalline. However, in this case the areas of single crystal are somewhat smaller, for example 2 square mm. to 12 square mm., but each of the single crystal areas is a single crystal throughout the entire thickness of the layer.

The solidification of the liquid layer on the substrate according to the invention is to be distinguished from epitaxial growth wherein liquid or gaseous materials are grown onto a substrate and assume the crystal orientation of substrate.

Thereafter, if a semiconductor device is desired, the semiconductor layer is doped with an impurity to provide a junction while the layer is still warm, preferably before cooling the semiconductor layer below 1040° C.

The surface of the layer 38 can then be plated in conventional manner with a conducting gridwork and electrical leads can be applied directly to the conducting gridwork and to the graphite layer to complete the semiconductor device. Devices of this nature are useful in electrical components such as solar cells.

Figure 2:
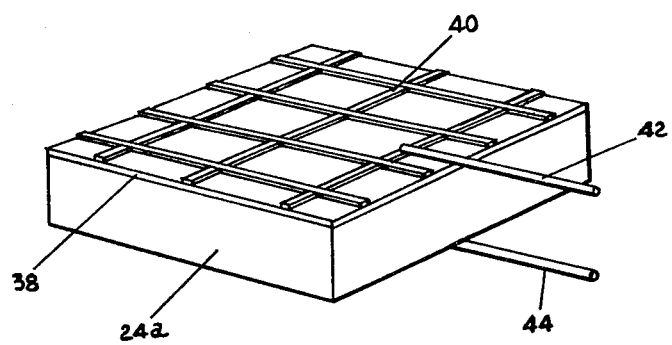
FIG. 2 is a perspective view showing a semiconductor solar cell made in accordance with the invention.

Reference is now made to FIG. 2 which illustrates a semiconductor device according to the invention. The semiconductor device has a base 24a which is a square or rectangle cut from the porous graphite boat 24 illustrated in FIG. 1. A uniform thin semiconducting single-crystal layer 38 is adherently positioned on the top surface of the substrate 24a. The semiconducting layer 38 desirably is doped in a conventional manner with an impurity to provide the desired junction thereto.

The semiconducting layer 38 extends into the pores of the graphite to form a uniquely effective electrical and mechanical bond. The interface between the graphite substrate and the semiconductor layer is substantially free from carbide formation, e.g. SiC. There is a good mechanical bond without adhesives due to the penetration of the semiconductor into the substrate.

A conductive gridwork 40 is plated onto the top surface of the layer 38 and an electrical lead 42 is electrically and mechanically connected to the grid work 40 by welding, soldering or other conventional techniques. An electrical lead 44 is also secured to the bottom of the substrate 24a in conventional fashion to provide an electrical connection thereto.

Although the invention finds considerable utility in growing thin predominantly single crystalline sheets or layers which can be as thin as 0.001 in. (0.025 mm.), thicker layers up to 0.25 in. (6.35 mm.) can also be grown according to the invention. Typically, however, the layers will be thinner than that obtainable under ordinary gravimetric conditions. Further, whereas the invention has been described with reference to the use of a graphite substrate, other materials such as aluminum, copper, silver, sapphire and quartz can also be used as substrates and form a substrate for the thin layers. Still further, whereas the invention has been described with reference to the use of portions of the boat itself as the substrate for a semiconductor material, the portions of the boat can be removed completely by grinding, peeling or other mechanical or chemical means to leave the crystalline layer free of a base.

Whereas the invention has been described with reference to the positioning of the crystal forming material into the boats prior to positioning the boats within the centrifuge, alternate techniques for providing the crystal forming material within the centrifuge can be provided. For example, the material can be injected into the boats as the boats are spinning with the container. Other container designs can also be provided for efficiency.

Whereas the invention has been described with reference to the application of heat to a normally solid material to render it molten, it should be understood that the invention finds application in cryogenic applications wherein singlecrystal formation of normally liquid materials is desired. The term "heating" and the term "cooling" are thus to be understood in the sense of transfer of thermal energy whether by natural processes or by artificial means such as electrical heating coils or by cooling coils. Thus, in cryogenic applications, the cooling process would take place with cooling coils and the heating process would take place with natural or ambient conditions.

Whereas the invention has been described with reference to the rotation of the substrate about a vertical axis, the process can be carried out also by rotating the substrate about an axis of any orientation so long as the surface of the substrate is parallel to the axis of rotation.

The invention will now be illustrated with the following specific examples:

EXAMPLE I

In an apparatus similar to that illustrated in FIG. 1, single crystalline films of silicon were formed on a porous graphite material. Both of the shapes shown in FIG. 1 were constructed from porous graphite having a porosity of 14% and sold under the commercial name of ULTRA-CARBON UT-44. The boats were 2.825 inches in length, 0.826 inch in width, and 0.165 inch thick from the central portion thereof to the bottom surface thereof. A seed crystal was placed in the upper portion of the boat and the boat was placed into a container similar to that illustrated in FIG. 1. The container had an inside diameter of 73 mm. with the result that the substrate surface of the boat on which the silicon was placed was at a radial distance of 30.9 mm. from the axis of rotation of the container. Induction coils and insulation were placed around the outside of the container in the manner illustrated in FIG. 1 and the container was closed. The inert gas, Argon, was introduced into the interior of the container. The container was then rotated around the central vertical axis and electrical energy was applied to the induction coils to heat the silicon on the graphite boat. The silicon was heated to a temperature of about 2,580° F while the container was rotated at a speed of 1306 rpms. The silicon was thus melted and the centrifugal force spread the silicon uniformly and thinly along substrate surface of the boat up to and in contact with the seed crystal. This process took approximately 38 minutes after which the coils were moved downwardly with respect to the container to progressively cool the molten silicon layer on the substrate. As the coils moved downwardly with respect to the container, the moltened film or layer was progressively cooled until the entire layer was solidified. The container was rotated during the entire process.

After allowing the layer to cool, the rotation of the container was stopped and the graphite boat was removed. The silicon layer was observed to be tightly adhered to the surface of the graphite substrate and appeared to be about 0.5 mm. in thickness. Visual observation indicated that the film was substantially single crystalline along the entire length and width. The film was 12.7 mm. by 63.5 mm. in surface area. The single crystal material extended through the entire thickness of the silicon layer. The film had a grain size of about 12 sq. mm.

EXAMPLE II

The procedure outlined in Example I was followed except that a seed crystal of silicon was not used. The progressive cooling technique was, however, employed.

The resulting film of silicon appeared to be much the same as that which resulted in Example I except that the film was somewhat less single crystalline. Otherwise, the length, width and thickness of the film appeared to be the same. The grain size of the film appeared to be 10 sq. mm.

EXAMPLE III

The procedure followed in Example II was carried out but without progressive cooling from the top to the bottom. In this procedure, the energy supplied to the heating coils was gradually reduced to effect a slow cooling of the entire silicon film while maintaining the speed of rotation of the container.

Subsequent to the cooling of the container, the rotation was stopped and the product was removed. The silicon layer was observed to have a thickness of about 0.25 mm. and the film had single crystal grains approximately 8 square mm. in size. Thus, the surface appearance was substantially the same as the surface of the film formed in Example II except that the grain size was slightly smaller.

EXAMPLE IV

A thin layer of silicon was prepared by slicing a single crystal formed by the Czochralski method. The silicon layer sliced from the single crystal rod was originally approximately 1.0 mm. in thickness. The layer was lapped until it was smooth. Thus, the resulting product was a thin layer of silicon much the same as that produced by Examples I through III except that the product of this example was monocrystalline whereas films formed by Examples I through III were polycrystalline but of relatively large grain size.

EXAMPLE V

The products produced by Examples I through IV were treated identically to form a semiconductor junction on the surface thereof. Boron was doped into the surface of each of the devices by a conventional solid phase deposition process. This process included a treatment of each of the samples with Boric Acid and Alundum at a temperature of 1040° C for 15 min.

Each of the samples made by Examples I through IV was cut into a shape of approximately 1.0 × 2.5 cm. An electrode was then plated on the top surface and to the bottom surface of the sample. An ammeter was connected to each of the electrodes and the sample was exposed to light energy of 0.1 watt/cm². The results of the tests are shown in the table below.

|  | Exposure* | Area of Sample | Electrical Output | Electrical Efficiency |
|---|---|---|---|---|
| Example I | 0.1 watt/cm² | 2.5 sq.cm. | 0.0173 watts | 6.9% |
| Example II | 0.1 watt/cm² | 2.5 sq.in | 0.0171 watts | 6.85% |
| Example III | 0.1 watt/cm² | 2.5 sq.cm. | 0.0152 watts | 6.1% |
| Example IV | 0.1 watt/cm² | 2.5 sq.cm. | 0.0180 watts | 7.2% |
| Commerical Solar Cell** | 0.1 watt/cm² | 20.27 sq.in. | 0.2030 watts | 10% |

*0.1 watt/cm² is the energy contained in normal sunlight on a cloudless day when measured perpendicular to the sun's rays.
**According to data supplied by Edmund Scientific Co.

The examples show that solar cells produced in the laboratory in accordance with the invention are substantially equal in effectiveness to those produced by prior art techniques. As shown by the table, commercially produced solar cells made by conventional techniques do achieve a slightly higher efficiency than those produced in accordance with the invention in the laboratory. However, such differences are believed to result from the imperfect conditions in the laboratory and not from any inferiority of the techniques according to the invention.

Reasonable variation and modification are possible within the scope of the foregoing disclosure without departing from the spirit of the invention which is defined in the accompanying claims.

The embodiments of the invention in which an exclusive property or privilege is claimed are defined as follows:

1. A method of forming a semiconductor device having a thin crystalline layer on a substrate from single crystal forming semiconductor material consisting essentially of a material which can be grown in single crystalline form onto a seed crystal at the melting point of the material, the method comprising the steps of:
   providing the single crystal forming semiconductor material in a molten state on a surface portion of the substrate, the substrate being of a conductive material other than the single crystal forming material;
   heating the crystal forming material to maintain its molten state and while the crystal forming material is in the molten state, rotating the substrate about an axis substantially parallel to the surface thereof at a speed sufficient to overcome the surface tension of the molten material so as to spread by centrifugal force the molten material into a thin, substantially uniform, molten layer of the single crystal forming material, thinner than that obtainable under ordinary gravimetric conditions;
   cooling the molten layer of the single crystal forming material while maintaining the speed of rotation of the substrate to solidify without epitaxial growth the entire thickness of the molten layer whereby a substantially monocrystalline thin semiconductive layer is formed on the substrate;
   doping the surface of the semiconductor layer subsequent to the cooling step;
   plating the doped semiconductor layer with a conductive grid; and
   wherein the substrate forms a conductor as a part of the semiconductor device.

2. A method of forming a semiconductor device according to claim 1 wherein said substrate surface is substantially perpendicular to the centrifugal force.

3. A method for forming a semiconductor device according to claim 2 wherein said substrate surface is rotated about a substantially vertical axis.

4. A method for forming a semiconductor device according to claim 3 wherein the liquid crystal forming material first contacts a seed crystal different form the substrate and on the substrate surface before the cooling step so that at least a portion of the single-crystal layer thus formed has the orientation of the seed crystal.

5. A method for forming a semiconductor device according to claim 4 wherein said cooling step takes place progessively along the substrate surface from said seed crystal.

6. A method for forming a semiconductor device according to claim 1 wherein the liquid crystal forming material first contacts a seed crystal different from the substrate and on the substrate before the cooling step and the cooling step takes place progressively along the substrate from the seed crystal so that at least a portion of the resulting crystalline layer has the orientation of the seed crystal.

7. A method for forming a semiconductor device according to claim 1 wherein the substrate surface is in the shape of a cylindrical section with a radius of curvature substantially equal to the distance from the axis of rotation to the substrate surface.

8. A method for forming a semiconductor device according to claim 1 wherein the cooling step takes place progressively along the substrate surface from an edge portion thereof.

9. A method for forming a semiconductor device according to claim 1 wherein the liquid crystal forming material contacts a seed crystal different from the substrate and on the substrate surface prior to the cooling step and the cooling takes place progressively along the substrate surface from the seed crystal.

10. A method of making a semiconductor device according to claim 1 and further comprising securing a first electrode to the conductive grid and securing a second electrode to the substrate.

11. A method of making a semiconductor device according to claim 1 wherein the substrate is a porous graphite having a thickness of at least 0.5 mm. and the molten crystal forming material is forced into the pores of the graphite substrate as the molten material is spread by centrifugal force.

12. A method of making a semiconductor device according to claim 11 wherein the graphite has a porosity in the range of 5% to 23%.

13. A method of making a semiconductor device according to claim 11 wherein the crystal forming material is silicon and the doping step takes place prior to cooling the semiconductor layer below 1040° C.

14. A method of making a semiconductor device according to claim 13 wherein the silicon is heated to a temperature in the range of 5° to 40° C above the melting point thereof during the heating and spreading steps.

15. A method of making a semiconductor device according to claim 1 wherein the crystal forming material is silicon.

16. A semiconductor device made according to the method of claim 14 wherein the silicon permeates pores of the graphite substrate at the interface between the substrate and the silicon, and the interface is substantially free of silicon carbide.

* * * * *